(12) United States Patent
Teh

(10) Patent No.: US 12,088,199 B2
(45) Date of Patent: Sep. 10, 2024

(54) POWER SUPPLY CIRCUIT

(71) Applicants: Kabushiki Kaisha Toshiba, Tokyo (JP); Toshiba Electronic Devices & Storage Corporation, Tokyo (JP)

(72) Inventor: Chen kong Teh, Ota Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 228 days.

(21) Appl. No.: 17/670,136

(22) Filed: Feb. 11, 2022

(65) Prior Publication Data

US 2023/0095863 A1 Mar. 30, 2023

(30) Foreign Application Priority Data

Sep. 24, 2021 (JP) ................. 2021-155252

(51) Int. Cl.
*H02M 3/158* (2006.01)
*G05F 1/652* (2006.01)
(Continued)

(52) U.S. Cl.
CPC ............ *H02M 3/158* (2013.01); *G05F 1/652* (2013.01); *H03K 17/08122* (2013.01); *H03K 17/687* (2013.01)

(58) Field of Classification Search
CPC .......... H03K 17/08122; H03K 17/687; H02M 1/0029; H02M 1/0048; H02M 1/32; H02M 3/07

See application file for complete search history.

(56) References Cited

U.S. PATENT DOCUMENTS 6,735,064 B2   5/2004  Miyazaki
8,095,015 B2   1/2012  Ichino
(Continued)

FOREIGN PATENT DOCUMENTS

JP    2003-289620 A   10/2003
JP      200955078 A    3/2009
(Continued)

OTHER PUBLICATIONS

Office Action issued on Jun. 4, 2024, in corresponding Japanese Application No. 2021-155252, 7 pages.

*Primary Examiner* — Metasebia T Retebo
(74) *Attorney, Agent, or Firm* — Maier & Maier, PLLC

(57) ABSTRACT

A power supply circuit in an embodiment includes a first transistor that supplies an output based on an input power supply voltage to a load or stops the supply of the output to the load, a second transistor, one end of a current path of which is connected to the gate of the first transistor and another end of the current path of which is connected to a reference potential point, the second transistor being turned on and off according to a level of a gate voltage of the second transistor, a capacitor connected between an input end of the power supply voltage and a gate of the second transistor, and a voltage holding circuit connected between the gate of the second transistor and the reference potential point and configured to hold the gate voltage of the second transistor.

6 Claims, 3 Drawing Sheets

(51) Int. Cl.
 *H03K 17/0812* (2006.01)
 *H03K 17/687* (2006.01)

(56) References Cited

U.S. PATENT DOCUMENTS

| | | |
|---|---|---|
| 8,299,841 B2 | 10/2012 | Fukuhara et al. |
| 2011/0234184 A1 | 9/2011 | Hong et al. |

FOREIGN PATENT DOCUMENTS

| | | | |
|---|---|---|---|
| JP | 2009141434 A | * | 6/2009 |
| JP | 4983424 B2 | | 7/2012 |
| JP | 5383426 B2 | | 1/2014 |
| JP | 201773657 A | | 4/2017 |
| JP | 2017099159 A | * | 6/2017 |
| KR | 20130073669 A | * | 7/2013 |

\* cited by examiner

POWER SUPPLY CIRCUIT

CROSS-REFERENCE TO RELATED APPLICATION

This application is based upon and claims the benefit of priority from the prior Japanese Patent Application No. 2021-155252 filed in Japan on Sep. 24, 2021; the entire contents of which are incorporated herein by reference.

FIELD

Embodiments described herein relate generally to a power supply circuit.

BACKGROUND

In a power supply circuit, a pull-down resistor has been sometimes adopted in order to prevent a rush current.

In order to cope with a steep change in a rush voltage that occurs in an input voltage, it is necessary to reduce a resistance value of the pull-down resistor. However, consumed power increases when the resistance value of the pull-down resistor is reduced.

DETAILED DESCRIPTION

A power supply circuit in an embodiment includes: a first transistor controlled to be turned on and off according to a control signal supplied to a gate to supply an output based on an input power supply voltage to a load or stop the supply of the output to the load; a second transistor, one end of a current path of which is connected to the gate of the first transistor and another end of the current path of which is connected to a reference potential point, the second transistor being turned on and off according to a level of a gate voltage of the second transistor; a capacitor connected between an input end of the power supply voltage and a gate of the second transistor; and a voltage holding circuit connected between the gate of the second transistor and the reference potential point and configured to hold the gate voltage of the second transistor.

Embodiments of the present invention are explained in detail below with reference to the drawings.

First Embodiment

Figure 1:
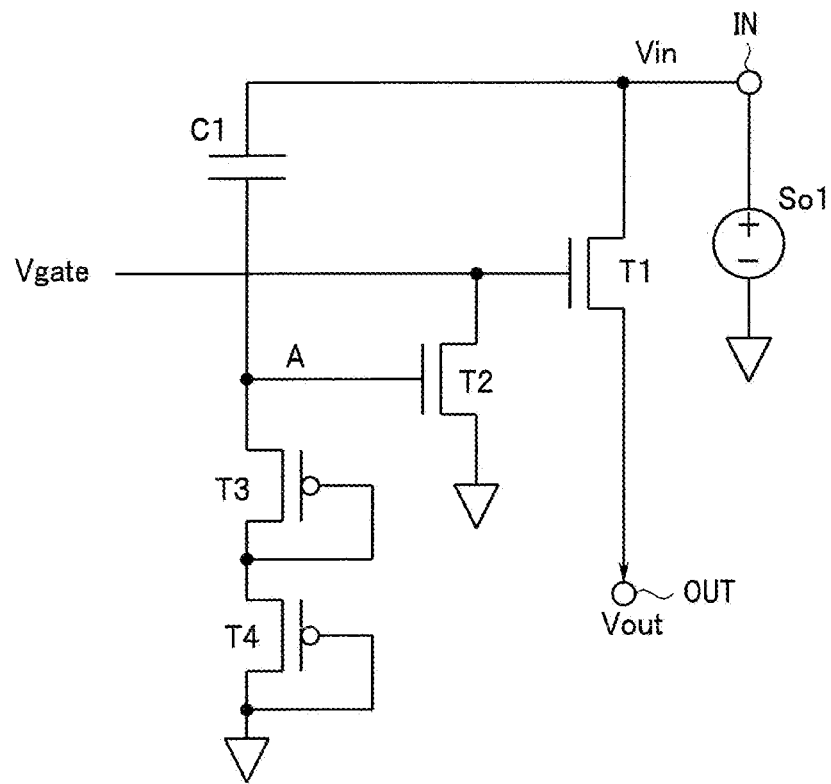
FIG. 1 is a block diagram showing a power supply circuit according to a first embodiment of the present invention.

FIG. 1 is a block diagram showing a power supply circuit according to a first embodiment of the present invention. In the present embodiment, a second transistor that pulls down a gate voltage of a first transistor configuring a main switch, a capacitor that transmits a rush voltage, and a voltage holding circuit that holds a voltage based on the rush voltage transmitted by the capacitor are provided to thereby prevent occurrence of a rush current while suppressing power consumption.

Figure 2:
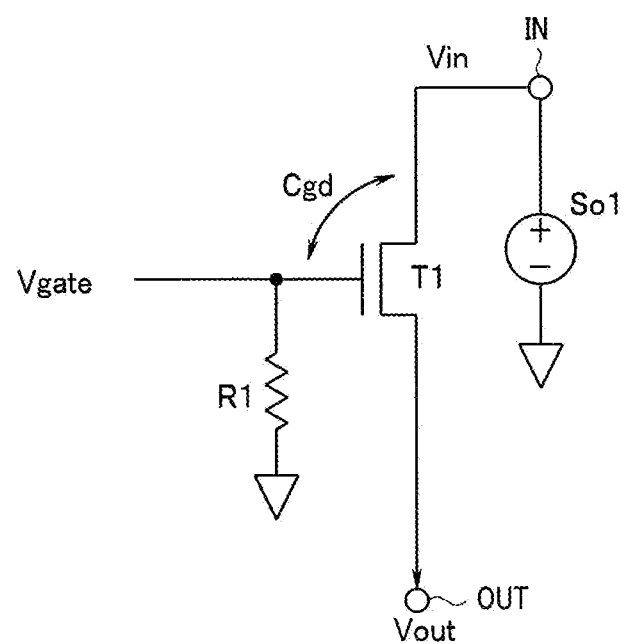
FIG. 2 is a circuit diagram showing a related art of a power supply circuit.

FIG. 2 is a circuit diagram showing a related art of a power supply circuit. Note that, in FIGS. 1 and 2, the same components are denoted by the same reference numeral and signs. Redundant explanation is omitted about the same components.

The power supply circuit shown in FIG. 2 includes an NMOS transistor T1 and a pull-down resistor R1 configuring a main switch. A negative polarity terminal of a voltage source So1 is connected to a reference potential point. The voltage source So1 generates a power supply voltage Vin in a positive polarity terminal. The power supply voltage Vin from the voltage source So1 is supplied to a drain of the transistor T1 via an input terminal IN of the power supply circuit.

A source of the transistor T1 is connected to an output terminal OUT of the power supply circuit. A not-shown load is connected to the output terminal OUT. A control signal Vgate for controlling whether to supply an output Vout from the power supply circuit to the load or stop the supply is applied to a gate of the transistor T1. The transistor T1 is turned on by the control signal Vgate at a high level (hereinafter referred to as H level). The output Vout based on the power supply voltage Vin is supplied to the load. The transistor T1 is turned off by the control signal Vgate at a low level (hereinafter referred to as L level). The supply of the output Vout based on the power supply voltage Vin to the load is stopped.

It is assumed that a rush voltage occurs in the power supply voltage Vin in a state in which the control signal Vgate is at the L level. Then, it is likely that a gate voltage of the transistor T1 is increased by parasitic capacitance Cgd between the gate and the drain of the transistor T1, the transistor T1 is turned on, and a large current (a rush current) flows to the load. Therefore, in the related art shown in FIG. 2, the pull-down resistor R1 is connected between the gate of the transistor T1 and the reference potential point.

In the example shown in FIG. 2 as well, there is no particular problem when a change in the rush voltage of the power supply voltage Vin is relatively slow (at a low slew rate). However, when the change in the rush voltage of the power supply voltage Vin is relatively fast (at a high slew rate), it is necessary to sufficiently reduce a resistance value of the pull-down resistor R1 in order to reduce an increase in the gate voltage of the transistor T1. Then, a relatively large current steadily flows from the gate of the transistor T1 to the reference potential point via the pull-down resistor R1 and consumed power increases.

(Configuration)

Therefore, in the present embodiment, a switch circuit with an NMOS transistor T2 is adopted instead of the pull-down resistor R1.

In FIG. 1, a current path of the transistor T2 is connected between the gate of the transistor T1 and the reference potential point. A drain of the transistor T2 is connected to the gate of the transistor T1, a source of the transistor T2 is connected to the reference potential point, and a gate of the transistor T2 is connected to a node A.

The node A is connected to a positive polarity input terminal of the voltage source So1 via a capacitor C1 and the input terminal IN. In other words, the power supply voltage Vin input to the power supply circuit is applied to one end of the capacitor C1. The other end of the capacitor C1 is connected to the node A. A steep change in the power supply voltage Vin is transmitted to the node A by the capacitor C1, which is a high-pass filter.

Respective current paths of PMOS transistors T3 and T4 are connected in series between the node A and the reference potential point. In other words, a source of the transistor T3 is connected to the node A and a gate and a drain of the transistor T3 are connected in common and connected to a source of the transistor T4. A gate and a drain of the transistor T4 are connected in common and connected to the reference potential point. Both of the transistors T3 and T4 function as diodes.

A sum voltage of forward voltages of the transistor T3 and the transistor T4 is set to a voltage higher than a voltage for turning on the transistor T2. Two diodes configured by the transistors T3 and T4 function as a voltage holding circuit that holds a voltage of the node A for a constant period. For example, depending on a configuration of the transistors T3 and T4, for example, the voltage of the node A, that is, the sum voltage of the forward voltages of the transistors T3 and T4 can be held for approximately one millisecond by the transistors T3 and T4.

The capacitor C1, the transistor T2, and the transistors T3 and T4 function as a protection circuit that prevents occurrence of a rush current by a rush voltage.

Note that, in general, a rush voltage that occurs in the power supply voltage Vin is in several microseconds order. For example, it is assumed that a circuit board (not shown) configuring the power supply circuit shown in FIG. 1 (hereinafter referred to as power supply board) is attached to not-shown another circuit board and the transistor T1 is connected to a bus of the other circuit board. When the power supply board is adopted to hot swapping, a rush voltage of the power supply voltage Vin sometimes occurs in the source of the transistor T1 when the power supply board is attached to the other circuit board. A period of the rush voltage that occurs in the power supply voltage Vin at such hot swapping time is equal to or shorter than one millisecond at most. A holding period of a voltage by the voltage holding circuit in the present embodiment is set to a period sufficiently longer than the period in which the rush voltage occurs.

(Action)

Next, an operation in the embodiment configured as explained above is explained.

The power supply voltage Vin of the voltage source So1 is supplied to the drain of the transistor T1. The supply of the output Vout corresponding to the power supply voltage Vin to the load is controlled by changing a level of the control signal Vgate to control turning on and off of the transistor T1.

(Normal Time)

It is assumed that it is a normal time when a rush voltage does not occur in the power supply voltage Vin. The gate (the node A) of the transistor T1 is connected to the reference potential point via the current paths of the transistors T3 and T4. Since a steep change does not occur in the power supply voltage Vin at the normal time, the voltage of the node A is reference potential. Therefore, the transistor T2 is off and the transistor T1 is turned on and off according to the level of the control signal Vgate.

In other words, when the control signal Vgate is at the L level, the transistor T1 is off and the supply of the output Vout based on the power supply voltage Vin to the load is in a stopped state. When the control signal Vgate is changed to the H level, the transistor T1 is turned on and the output Vout based on the power supply voltage Vin is supplied to the load.

(Rush Voltage Occurrence Time)

It is assumed that the control signal Vgate is at the L level. It is assumed that a rush voltage occurs in the power supply voltage Vin. The rush voltage that occurs in the power supply voltage Vin is instantaneously transmitted to the node A by the capacitor C1. The node A is connected to the reference potential point through the respective current paths of the transistors T3 and T4. The node A has the sum voltage of the forward voltages of the transistors T3 and T4. The voltage of the node A is held for a predetermined length of a period (hereinafter referred to as holding period) by a voltage holding function of the transistors T3 and T4. The voltage of the node A in this case is higher than a threshold voltage of the transistor T2. In the holding period, the transistor T2 is turned on. It is possible to feed a large current from the gate of the transistor T1 to the reference potential point through the current path of the transistor T2.

The gate voltage of the transistor T1 is about to increase with the parasitic capacitance Cgd of the transistor T1 because of influence of the rush voltage that occurs in the power supply voltage Vin. However, when the transistor T2 is turned on, a large current flows from the gate of the transistor T1 to the reference potential point. Even if a rush voltage at a high slew rate occurs, an increase in the gate voltage of the transistor T1 is suppressed. Since the period in which the rush voltage occurs in the power supply voltage Vin ends within the holding period, the transistor T1 is not turned on because of the influence of the rush voltage that occurs in the power supply voltage Vin.

In this way, in a period in which the control signal Vgate is at the L level, even if a rush voltage occurs in the power supply voltage Vin, a large current is prevented from flowing to the load.

At the normal time, the transistor T2 is off, an electric current does not flow from the gate of the transistor T2 to the reference potential point, and consumed power does not increase.

As explained above, in the present embodiment, even if a rush voltage at a high slew rate occurs, it is possible to surely prevent a large current from flowing to the load. Consumed power does not increase at the normal time.

For example, the present embodiment can be used as a protection circuit for hot swapping. Note that an example in which the present embodiment prevents a rush current by a rush voltage in the power supply circuit is explained. However, the present embodiment is also applicable to prevention of occurrence of a rush current with respect to a rush voltage that occurs in an electron fuse, a linear regulator, a DCDC converter, a gate driver, or the like.

Second Embodiment

Figure 3:
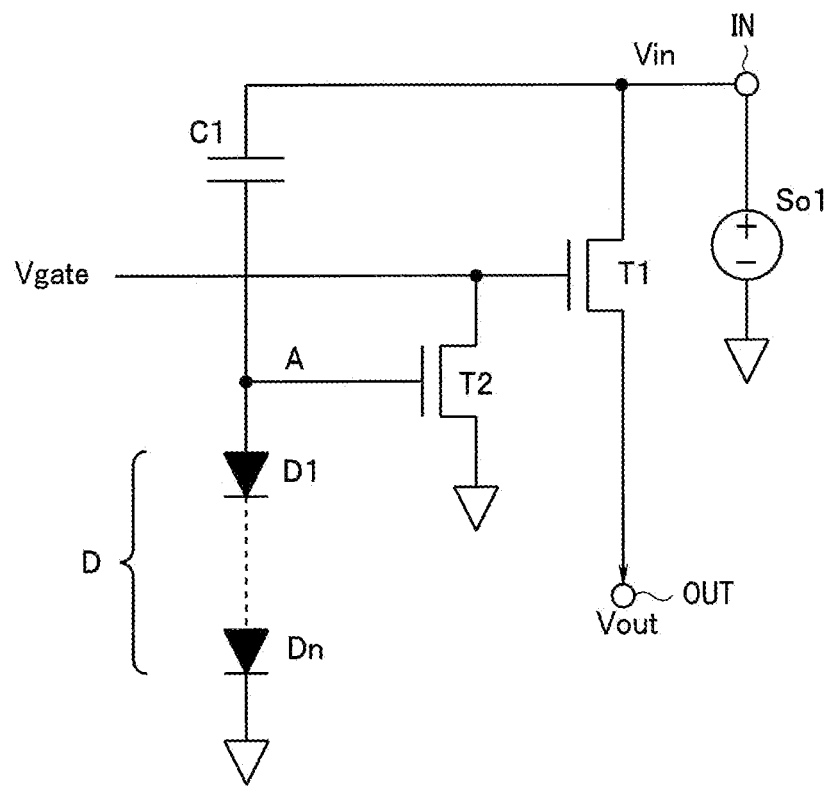
FIG. 3 is a circuit diagram showing a second embodiment of the present invention.

FIG. 3 is a circuit diagram showing a second embodiment of the present invention. In FIG. 3, the same components as the components shown in FIG. 1 are denoted by the same reference numerals and signs. Explanation of the components is omitted. In the present embodiment, the voltage holding circuit configured by the transistors T3 and T4 in the first embodiment is configured by one or more diodes.

The present embodiment is different from the embodiment shown in FIG. 1 in that one diode D1 or two or more diodes D1, D2, . . . , and Dn (one or more diodes are hereinafter referred to as diodes D) are adopted instead of the transistors T3 and T4. When the one diode D1 is adopted as the diodes D, an anode of the diode D1 is connected to the node A and a cathode of the diode D1 is connected to the reference potential point. When two or more diodes are adopted as the diodes D, an anode of each of the respective diodes of the diodes D is connected to a cathode of a diode at a pre-stage and a cathode of each of the respective diodes is connected to an anode of a diode at a post-stage. An anode of the diode D1 at a first stage is connected to the node A and a cathode of the diode Dn at a final stage is connected to the reference potential point.

A sum of forward voltages of the diodes D functioning as the voltage holding circuit is set to a voltage higher than the voltage for turning on the transistor T2. A holding period of the voltage of the node A by the diodes D is set to a period sufficiently longer than the period in which the rush voltage occurs.

The capacitor C1, the transistor T2, and the diodes D function as a protection circuit that prevents occurrence of a rush current by a rush voltage.

In the embodiment configured as explained above, the same action as the action in the first embodiment is obtained.

In other words, the rush voltage that occurs in the power supply voltage Vin is instantaneously transmitted to the node A by the capacitor C1. The voltage of the node A is maintained by the diodes D at the voltage for turning on the transistor T2. The voltage of the node A is held by the diodes D for a holding period longer than the period in which the rush voltage occurs. The transistor T2 is turned on in this period. Consequently, even if a rush voltage at a high slew rate occurs in the power supply voltage Vin in the L level period of the control signal Vgate, the transistor T1 is prevented from being turned on. In this way, a large current is prevented from flowing to the load because of the occurrence of the rush voltage. At the normal time, the transistor T2 is off, an electric current does not flow from the gate of the transistor T2 to the reference potential point, and consumed power does not increase.

As explained above, in the present embodiment, the same effects as the effects in the first embodiment can be obtained.

Third Embodiment

Figure 4:
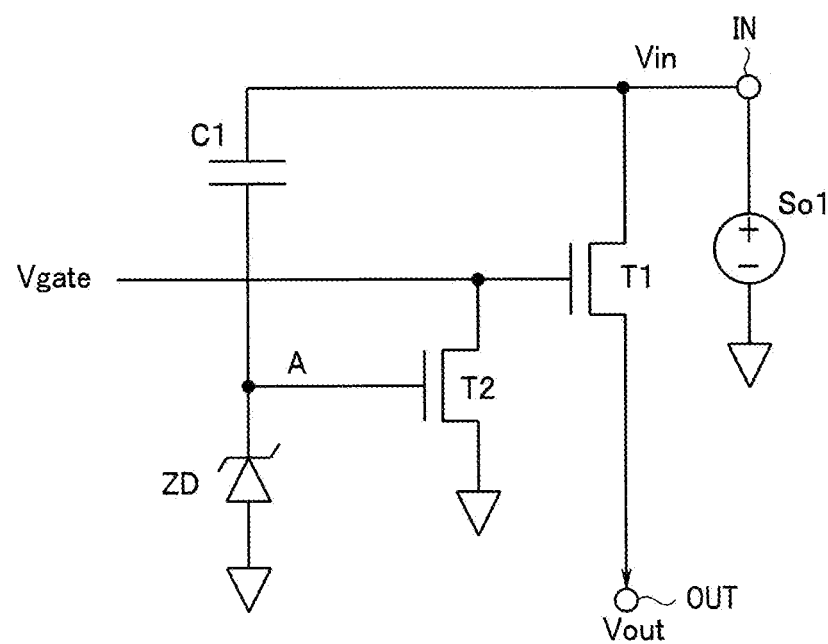
FIG. 4 is a circuit diagram showing a third embodiment of the present invention.

FIG. 4 is a circuit diagram showing a third embodiment of the present invention. In FIG. 4, the same components as the components shown in FIG. 1 are denoted by the same reference numerals and signs. Explanation of the components is omitted. In the present embodiment, the voltage holding circuit configured by the transistors T3 and T4 in the first embodiment is configured by a Zener diode.

The present embodiment is different from the embodiment shown in FIG. 1 in that a Zener diode ZD is adopted instead of the transistors T3 and T4. An anode of the Zener diode ZD is connected to the node A and a cathode of the Zener diode ZD is connected to the reference potential point.

A Zener voltage of the Zener diode ZD functioning as the voltage holding circuit is set to a voltage higher than the voltage for turning on the transistor T2. A holding period of the voltage of the node A by the Zener diode ZD is set to a period sufficiently longer than the period in which the rush voltage occurs.

The capacitor C1, the transistor T2, and the Zener diode ZD function as a protection circuit that prevents occurrence of a rush current by a rush voltage.

In the embodiment configured as explained above, the same action as the action in the first embodiment is obtained.

In other words, the rush voltage that occurs in the power supply voltage Vin is instantaneously transmitted to the node A by the capacitor C1. The voltage of the node A is maintained by the Zener diode ZD at the voltage for turning on the transistor T2. The voltage of the node A is held by the Zener diode ZD for a holding period longer than the period in which the rush voltage occurs. The transistor T2 is turned on in this period. Consequently, even if a rush voltage at a high slew rate occurs in the power supply voltage Vin in an L level period of the control signal Vgate, the transistor T1 is prevented from being turned on. In this way, a large current is prevented from flowing to the load because of the occurrence of the rush voltage. At the normal time, the transistor T2 is off, an electric current does not flow from the gate of the transistor T2 to the reference potential point, and consumed power does not increase.

As explained above, in the present embodiment, the same effects as the effects in the first embodiment can be obtained.

Fourth Embodiment

Figure 5:
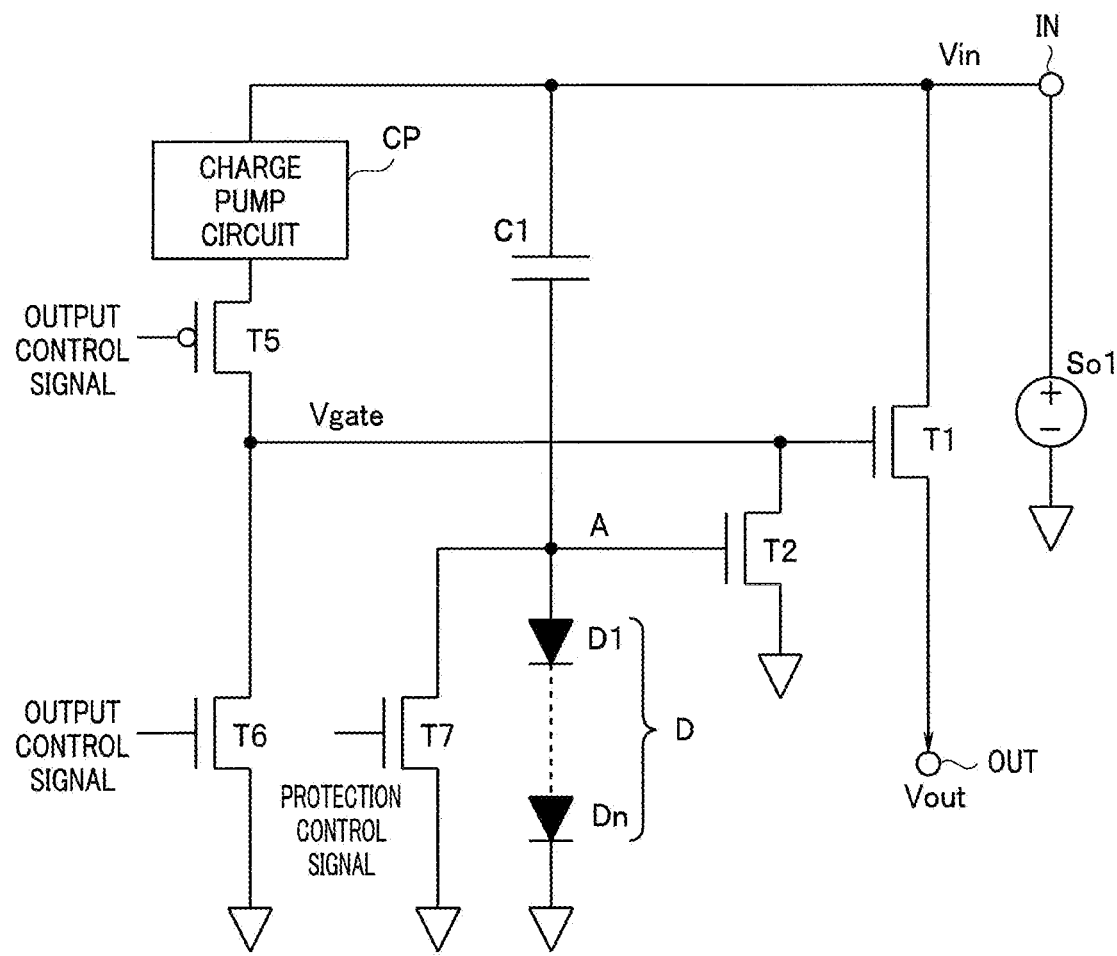
FIG. 5 is a circuit diagram showing a fourth embodiment of the present invention.

FIG. 5 is a circuit diagram showing a fourth embodiment of the present invention. In FIG. 5, the same components as the components shown in FIG. 3 are denoted by the same reference numerals and signs. Explanation of the components is omitted. The present embodiment is different from the respective embodiments explained above in that a function of stopping the operation of the protection circuit in the respective embodiments is added. Note that FIG. 5 shows an example in which the present embodiment is applied to the second embodiment. However, the present embodiment is applicable to the first and third embodiments as well.

The present embodiment is different from the respective embodiments explained above in that a charge pump circuit CP, a PMOS transistor T5, and NMOS transistors T6 and T7 are added. In the present embodiment, the control signal Vgate is generated by the charge pump circuit CP and the transistors T5 and T6. In order to turn on the transistor T1, the control signal Vgate needs to be a voltage higher than the power supply voltage Vin. The power supply voltage Vin is supplied to the charge pump circuit CP. The charge pump circuit CP generates a voltage higher than the power supply voltage Vin using the power supply voltage Vin and outputs the voltage.

Current paths of the transistors T5 and T6 are connected in series between an output terminal of the charge pump circuit CP and the reference potential point. In other words, a source of the transistor T5 is connected to an output of the charge pump circuit CP, a drain of the transistor T5 is connected to the gate of the transistor T1, and an output control signal is given to agate of the transistor T5. A drain of the transistor T6 is connected to the gate of the transistor T1, a source of the transistor T6 is connected to the reference potential point, and the output control signal is given to a gate of the transistor T6.

When the output control signal is at the H level, the transistor T5 is off, the transistor T6 is on, the control signal Vgate is changed to the L level, and the transistor T1 is turned off. In other words, when the output control signal at the H level is supplied to the gates of the transistors T5 and T6, the supply of the output Vout to the load is stopped. In other words, the main switch is changed to an off state by the output control signal at the H level.

When the output control signal is at the L level, the transistor T5 is on, the transistor T6 is off, the control signal Vgate is changed to the H level by the output of the charge pump circuit CP, and the transistor T1 is turned on. In other words, when the output control signal at the L level is supplied to the gates of the transistors T5 and T6, the output Vout is supplied to the load. In other words, the main switch is changed to an on state by the output control signal at the L level.

The node A is connected to the reference potential point through a current path of the transistor T7. A drain of the transistor T7 is connected to the node A, a source of the transistor T7 is connected to the reference potential point, and a protection control signal is given to a gate of the transistor T7.

When the protection control signal is at the L level, the transistor T7 is off and the transistor T7 does not act on the node A. In other words, in this case, since a rush voltage occurs in the power supply voltage Vin, the voltage of the node A is maintained at the voltage for turning on the transistor T2 for the holding period. As a result, as explained above, irrespective of the occurrence of the rush voltage, the transistor T1 is inhibited from being turned on and a large current is prevented from flowing to the load.

However, in other words, in a period in which the voltage of the node A is maintained by the protection circuit at the voltage for turning on the transistor T2, even if the output control signal at the L level for turning on the main switch is supplied to the gates of the transistors T5 and T6, the control signal Vgate remains at the L level and the output Vout cannot be supplied to the load. For example, when the holding period is too long, even if the main switch is turned on, the output Vout is not output. The transistor T7 prevents such a malfunction of the protection circuit.

In the present embodiment, the protection control signal is at the L level in the period in which the rush voltage occurs in the power supply voltage Vin and is at the H level in other periods. For example, the protection control signal may be set to be at the L level for a predetermined period from the occurrence of the rush voltage. Alternatively, the protection control signal may be set to the H level in a period of the output control signal at the L level for turning on the main switch.

When the protection control signal is at the H level, the transistor T7 is on and potential of the node A is reduced to reference potential. Consequently, the transistor T2 is turned off and the gate voltage of the transistor T1 is not reduced. In other words, in this case, the transistor T1 is turned on and off according to the control signal Vgate corresponding to a level of the output control signal. The supply of the output Vout to the load is controlled.

In the embodiment configured as explained above, when the protection control signal is at the L level, action at the rush voltage occurrence time is the same as the action in the respective embodiments explained above. In other words, in this case, a voltage increase of the control signal Vgate is inhibited by the protection circuit, the transistor T1 maintains off, and a large current is prevented from flowing to the load.

On the other hand, for example, in a period in which the output control signal at the L level for turning on the main switch is applied to the gates of the transistors T5 and T6, the protection control signal is changed to the H level. In this case, the transistor T7 is turned on, the potential of the node A is changed to the reference potential, and the transistor T2 is turned off. Consequently, the control signal Vgate is changed to the H level according to the output control signal at the L level and the transistor T1 is turned on. In this way, it is possible to supply the output Vout to the load by turning on the main switch.

As explained above, in the present embodiment, it is possible to stop the operation of the protection circuit. It is possible to prevent a malfunction of the protection circuit and enable supply of the output Vout to the load.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A power supply circuit comprising:
a first transistor controlled to be turned on and off according to a control signal supplied to a gate, the first transistor including one end to which a power supply voltage is applied, and another end connected to a load, and being configured to supply an output based on the power supply voltage to the load or stop the supply of the output to the load;
an N-type second transistor, a drain of the second transistor being connected to the gate of the first transistor, a source of the second transistor being connected to a reference potential point, the second transistor being turned on and off according to a level of a gate voltage of the second transistor;
a capacitor connected between the one end of the first transistor to which the power supply voltage is applied and a gate of the second transistor; and
a voltage holding circuit connected between the gate of the second transistor and the reference potential point and configured to hold the gate voltage of the second transistor.

2. The power supply circuit according to claim 1, wherein the voltage holding circuit holds, based on a voltage transmitted to the gate of the second transistor by the capacitor, a voltage for turning on the second transistor.

3. The power supply circuit according to claim 1, wherein the voltage holding circuit is configured by one or more diode-connected MOS transistors.

4. The power supply circuit according to claim 1, wherein the voltage holding circuit is configured by one diode or two or more diodes connected in cascade.

5. The power supply circuit according to claim 1, wherein the voltage holding circuit is configured by a Zener diode.

6. The power supply circuit according to claim 1, further comprising a third transistor, one end of a current path of the third transistor being connected to the gate of the second transistor, another end of the current path of the third transistor being connected to the reference potential point, the third transistor being turned on and off according to a level of a gate voltage of the third transistor.

* * * * *